United States Patent
Nagatomi et al.

(10) Patent No.: US 7,477,009 B2
(45) Date of Patent: Jan. 13, 2009

(54) PHOSPHOR MIXTURE AND LIGHT EMITTING DEVICE

(75) Inventors: Akira Nagatomi, Tokyo (JP); Masahiro Gotoh, Tokyo (JP); Kenji Sakane, Tokyo (JP)

(73) Assignees: DOWA Electronics Materials Co., Ltd., Tokyo (JP); Nichia Corporation, Anan-shi (JP)

( * ) Notice: Subject to any disclaimer, the term of this patent is extended or adjusted under 35 U.S.C. 154(b) by 729 days.

(21) Appl. No.: 11/198,281

(22) Filed: Aug. 8, 2005

(65) Prior Publication Data

US 2006/0197432 A1   Sep. 7, 2006

(30) Foreign Application Priority Data

Mar. 1, 2005 (JP) .............................. 2005-056418

(51) Int. Cl.
   *H01J 63/04* (2006.01)
   *H01J 1/62* (2006.01)
(52) U.S. Cl. .................. 313/487; 313/483; 313/486; 313/498; 313/512; 313/501
(58) Field of Classification Search ................ None
   See application file for complete search history.

(56) References Cited

U.S. PATENT DOCUMENTS

| | | | |
|---|---|---|---|
| 18,985 | A | 12/1857 | Olds |
| 2,121,275 | A | 6/1938 | Zober et al. |
| 3,527,595 | A | 9/1970 | Adler et al. |
| 3,697,301 | A | 10/1972 | Donofrio et al. |
| 4,477,689 | A | 10/1984 | Ogasahara et al. |
| 4,576,736 | A | 3/1986 | Harmuth |
| 5,398,398 | A | 3/1995 | Williams et al. |

(Continued)

FOREIGN PATENT DOCUMENTS

EP   0 459 156 A2   4/1991

(Continued)

OTHER PUBLICATIONS

K. Uheda et al., "The Crystal Structure and Photoluminescence Properties of a New Red Phosphor, Calcium Aluminum Silicon Nitride Doped With Divalent Euroium," Abs. 2073, 206$^{th}$ Meeting., Oct. 3, 2004.

(Continued)

*Primary Examiner*—Sikha Roy
*Assistant Examiner*—Natalie K Walford
(74) *Attorney, Agent, or Firm*—Oliff & Berridge, PLC (57) ABSTRACT

To provide a phosphor mixture realizing a light emitting device having a phosphor and a light emission element, by which light emission is performed, with a small color shift due to a feeding current and having an excellent color rendering properties. $CaAlSiN_3:Eu$ as a red phosphor and YAG:Ce as a yellow phosphor are manufactured, and emission spectra thereof are obtained. Meanwhile, the emission spectrum of an excitation light emitted by a light emitting part is obtained. From the emission spectra thus obtained, a relative mixing ratio of each phosphor is obtained by simulation, so that a correlated color temperature of the light emitting device becomes a target temperature. Then, based on the relative mixing ratio thus obtained, each phosphor is measured and mixed, and a phosphor mixture is thereby obtained.

19 Claims, 6 Drawing Sheets

U.S. PATENT DOCUMENTS

| | | | |
|---|---|---|---|
| 5,447,291 | A | 9/1995 | Sandhage |
| 5,600,202 | A | 2/1997 | Yamada et al. |
| 6,180,029 | B1 | 1/2001 | Hampden-Smith et al. |
| 6,504,297 | B1 | 1/2003 | Heo et al. |
| 6,670,748 | B2 | 12/2003 | Ellens et al. |
| 7,138,756 | B2 | 11/2006 | Gotoh et al. |
| 2002/0043926 | A1 | 4/2002 | Takahashi et al. |
| 2003/0030038 | A1 | 2/2003 | Mitomo et al. |
| 2003/0030368 | A1 | 2/2003 | Ellens et al. |
| 2003/0094893 | A1 | 5/2003 | Ellens et al. |
| 2003/0132422 | A1 | 7/2003 | Tian et al. |
| 2003/0152804 | A1 | 8/2003 | Miura et al. |
| 2003/0213611 | A1 | 11/2003 | Morita |
| 2004/0155225 | A1 | 8/2004 | Yamada et al. |
| 2004/0263074 | A1 | 12/2004 | Baroky et al. |
| 2005/0001225 | A1 | 1/2005 | Yoshimura et al. |
| 2005/0189863 | A1 | 9/2005 | Nagatomi et al. |
| 2005/0203845 | A1 | 9/2005 | Yoshimine et al. |
| 2005/0205845 | A1 | 9/2005 | Deising et al. |
| 2005/0253500 | A1 | 11/2005 | Gotoh et al. |
| 2005/0267243 | A1 | 12/2005 | Amasaki et al. |
| 2006/0006782 | A1 | 1/2006 | Nagatomi et al. |
| 2006/0017365 | A1 | 1/2006 | Nagatomi et al. |
| 2006/0021788 | A1 | 2/2006 | Kohayashi et al. |
| 2006/0022573 | A1 | 2/2006 | Gotoh et al. |
| 2006/0033083 | A1 | 2/2006 | Sakane et al. |
| 2006/0043337 | A1 | 3/2006 | Sakane et al. |
| 2006/0045832 | A1 | 3/2006 | Nagatomi et al. |
| 2006/0065878 | A1 | 3/2006 | Sakane et al. |
| 2006/0076883 | A1 | 4/2006 | Himaki et al. |
| 2006/0091790 | A1 | 5/2006 | Nagatomi et al. |
| 2006/0170332 | A1 | 8/2006 | Tamaki et al. |
| 2006/0197432 | A1 | 9/2006 | Nagatomi et al. |
| 2006/0197439 | A1 | 9/2006 | Sakane et al. |
| 2006/0220047 | A1 | 10/2006 | Nagatomi et al. |
| 2006/0220520 | A1 | 10/2006 | Sakane et al. |
| 2006/0244356 | A1 | 11/2006 | Nagatomi et al. |
| 2007/0007494 | A1 | 1/2007 | Hirosaki et al. |
| 2007/0029525 | A1 | 2/2007 | Gotoh et al. |
| 2007/0164308 | A1 | 7/2007 | Yoshimura et al. |

FOREIGN PATENT DOCUMENTS

| | | |
|---|---|---|
| EP | 1 296 376 A2 | 3/2003 |
| EP | 1 445 295 A1 | 8/2004 |
| JP | 05-015655 | 1/1993 |
| JP | 05-198433 | 8/1993 |
| JP | 11-144938 | 5/1999 |
| JP | 11-277527 | 10/1999 |
| JP | 2000-073053 | 3/2000 |
| JP | 2000-153167 | 6/2000 |
| JP | 2001-214162 | 8/2001 |
| JP | 2002-363554 | 12/2002 |
| JP | 2003-013059 | 1/2003 |
| JP | 2003-096446 | 4/2003 |
| JP | 2003-124527 | 4/2003 |
| JP | 2003-515655 | 7/2003 |
| JP | 2003-277746 | 10/2003 |
| JP | 2003-336059 | 11/2003 |
| JP | 2004-055910 | 2/2004 |
| JP | 2004-505470 | 2/2004 |
| JP | 2004-067837 | 3/2004 |
| JP | 2004-145718 | 5/2004 |
| JP | 2004-166058 | 6/2004 |
| JP | 2004-189997 | 7/2004 |
| JP | 2004-207271 | 7/2004 |
| JP | A-2004-186278 | 7/2004 |
| JP | 2004-248405 | 8/2004 |
| JP | 2004-250920 | 8/2004 |
| JP | 2004-253312 | 8/2004 |
| JP | A-2004-235598 | 8/2004 |
| JP | 2004-244560 | 9/2004 |
| JP | 2004-055536 | 12/2004 |
| JP | 2004-368153 | 12/2004 |
| JP | 2005-075854 | 3/2005 |
| JP | 2005-103429 | 3/2005 |
| JP | 2005-105126 | 3/2005 |
| JP | 2005-192691 | 6/2005 |
| JP | 2005-344025 | 12/2005 |
| JP | 2006-028295 | 2/2006 |
| JP | 2006-063214 | 3/2006 |
| JP | 2006-063286 | 3/2006 |
| JP | 2006-070109 | 3/2006 |
| JP | 2006-176546 | 7/2006 |
| JP | A-2006-282809 | 10/2006 |
| JP | A-2006-282872 | 10/2006 |
| WO | WO 01/40403 A1 | 6/2001 |
| WO | WO 02/11214 A1 | 2/2002 |
| WO | WO 2004/030109 A1 | 4/2004 |
| WO | WO 2004/039915 A1 | 5/2004 |
| WO | WO 2004/055910 A1 | 7/2004 |
| WO | WO 2005/052087 A1 | 6/2005 |
| WO | WO 2006/093298 A1 | 9/2006 |

OTHER PUBLICATIONS

U.S. Appl. No. 194,590, filed Aug. 2, 2005.
U.S. Appl. No. 10/984,772, filed Nov. 10, 2004, Nagatomi et al.
U.S. Appl. No. 11/061,669, filed Feb. 22, 2005, Nagatomi et al.
U.S. Appl. No. 11/063,847, filed Feb. 23, 2005, Sakane et al.
U.S. Appl. No. 11/149,317, filed Jun. 10, 2005, Nagatomi et al.
U.S. Appl. No. 11/149,192, filed Jun. 10, 2005, Sakane et al.
U.S. Appl. No. 11/194,590, filed Aug. 2, 2005, Gotoh et al.
U.S. Appl. No. 11/211,751, filed Aug. 26, 2005, Sakane et al.
U.S. Appl. No. 11/218,504, filed Sep. 6, 2005, Nagatomi et al.
JIS Z 8726; "Method of Specifying Colour Rendering Properties of Light Sources"; (1990), pp. 381-390.
"Phosphor Handbook"; (compiled by Phosphor Research Society, published by Ohmusha, Ltd., 1987); pp. 172-176.

PHOSPHOR MIXTURE AND LIGHT EMITTING DEVICE

BACKGROUND OF THE INVENTION

1. Field of the Invention

The present invention relates to a phosphor mixture used for an illumination device such as a light emitting diode (LED), a fluorescent display tube, and a fluorescent lamp, and a light emitting device using the phosphor mixture.

2. Description of the Related Art

As a light emitting device conventionally used as an illumination device, a discharge-type fluorescent lamp and an incandescent lamp and so forth are given as examples. However, in recent years, a white LED lighting unit using a light emitting diode (referred to as LED in some cases hereafter) that emits white light has been developed. Compared with the conventional light source for illumination, the white LED lighting unit serves as an ideal illumination device having advantages that the heat generation is reduced, an emission efficiency is excellent, power consumption is reduced, composed of only LED element or LED element and a phosphor, having long service life without blowing filament as is seen in the conventional incandescent light bulb, and capable of eliminating a harmful material such as mercury having an influence on the environment, which is indispensable to the conventional fluorescent lamp.

As required elements for a light source for a general lighting unit such as the aforementioned white LED lighting unit, the elements of luminance and color rendering properties are given as examples. The color rendering properties are values expressing a reproducibility of color by the light source, and generally, JIS Z 8726(1990) is defined as an evaluation method of the color rendering properties. Therefore, hereafter, the color rendering properties will be explained by using the evaluation method of the JIS Z 8726.

According to the JIS Z 8726, the color rendering properties of the light source is expressed in a numeric value by a general color rendering index (Ra). This is the value by which the difference between the color of a color rendering reference sample when illuminated by a sample light source, and the color of the reference sample when irradiated with a reference light analogous to a natural light is evaluated. When there is no difference between above two colors, showing absolutely the same color, the color rendering index is expressed by 100. Even if having the same correlated color temperature of the light source, the way of looks of color due is varied according to the color rendering index, and if the color rendering index is low, the color due looks darker and dull. Therefore, the light source having an uniform emission intensity over the whole visible light region can emit light close to a reference light and can be the light source with excellent color rendering properties.

At present, one of the examples of the white LED lighting unit developed as a general lighting unit functions to obtain an emission that looks white for human eyes, by combining the LED emitting blue color and the phosphor emitting yellow color under an excitation of the blue emission, and synthesizing the blue emission and the yellow emission. However, in this system, since the emission that looks white is formed of the lights of blue color and yellow color, a problem involved therein is that the lights of green region and red region are extremely insufficient. Particularly, a color component of a long wavelength side of the visible light region, that is, the component of red color is insufficient. Therefore, the emission looks slightly bluish white, although it looks white at first glance. Accordingly, when the aforementioned white LED lighting unit is used as the general lighting unit, as for a red object, it looks significantly dull red and deteriorated in color reproducibility, thereby being improper as a general lighting unit.

In order to improve the color rendering properties of the aforementioned white LED lighting unit synthesizing the blue emission and the yellow emission, the white LED lighting unit has been developed with improved color rendering properties, having a structure in which the blue LED, the phosphor emitting yellow light under the excitation of the blue light emitted by the LED, and the phosphor emitting red light under the excitation of the blue light emitted by the LED are combined, namely, the blue emission, the yellow emission, and the red emission are combined, to obtain a white emission. The white LED lighting unit thus constructed to obtain the white light by combination of the blue light emitting LED and a plurality of phosphors, is capable of obtaining an arbitrary emission color in addition to the white light, according to the combination and mixing ratio of the phosphors.

For example, patent document 1 discloses the phosphors containing nitrogen such as silicon nitride-based phosphors including $(Ca, Sr, Ba)_2Si_5N_8$:Eu, as a red phosphor having an improved excitation band in the long wavelength side, and capable of obtaining an emission peak with a large half value width. In addition, the light emitting device having improved color rendering properties is proposed, by combining the blue emitting LED, the red phosphor emitting red light under the excitation of the blue light emitted by the LED, and yellow light emitting YAG:Ce and so forth. However, when increasing the emission intensity of the white LED lighting unit, a phenomenon of so-called "color shift" occurs, which is a problem of making it impossible to obtain a target emission color. Therefore, in order to solve the phenomenon of the "color shift", patent document 2 proposes the phosphor mixture used by mixing the phosphors having approximately the same deterioration in emission characteristic at temperature rise. (Patent document 1) International Publication WO2004/039915 A1 Pamphlet (Patent document 2) Japanese Patent Laid-Open No.2004-235598

However, according to the study by the inventors of the present invention, it is found that even when green to orange phosphors and the silicon nitride-based red phosphor containing nitrogen shown by the patent document 2 are mixed, and the phosphor mixture thus obtained and the light emission element (LED) are combined, to thereby manufacture the light-emitting device, and by feeding an electric current to the light emitting device, the white light having a low correlative color temperature is obtained, the degree of the color shift is yet large, and the light with high color rendering properties is not obtained.

In view of the above-described circumstances, the present invention is provided, and an object of the present invention is to provide the phosphor mixture used in the light emitting device such as the white LED lighting unit, which is the phosphor mixture that hardly generates the color shift even when strong emission is obtained from the LED used for the white LED lighting unit or the like, and the light emitting device having the phosphor mixture and the light emitting part that hardly generates the "color shift".

SUMMARY OF THE INVENTION

In order to solve the above-described problem, after pursuit of the cause of a "color shift", the inventors of the present invention reaches the conclusion as will be described hereunder.

Specifically, in regards to a temperature characteristic of the aforementioned red phosphor containing nitrogen, decrease in an emission efficiency is relatively small at the temperature of not less than 50° C., and approximately the same light emission characteristic is exhibited as that of a garnet phosphor used as green to orange phosphors with Ce used as an activator. However, the emission efficiency is extremely decreased, thereby also decreasing in emission intensity at the temperature of not less than 100° C. Therefore, difference in emission efficiency is huge between the red phosphor and the green to orange garnet phosphors, thus causing a large color shift.

Then, after examination of the temperature of a heat generation of the LED, it is found that although the heat generation usually occurs at 50 to 100° C. or around in a small-size light emitting device, by increasing an amount of feeding electricity to the LED, sealing the LED by resin, and improving a structure of a lead frame to obtain a further strong light emission, the temperature of the heat generation and an amount of the heat generation are increased accordingly, and in some cases, the temperature of the part of the resin or the phosphor mixture exceeds 100° C. As a result, a peak value of the relative emission intensity of each phosphor is fluctuated, the phenomenon of "color shift" occurs in the white LED lighting unit, and the shift of color occurs in the white light emitting device in which the blue LED, the green to orange phosphors, and the aforementioned silicon nitride-based red phosphor containing nitrogen are combined. Further, in the future, further strong light emission is desired for the light emitting device, and therefore taking a practical reliability into consideration, when the temperature of the phosphor mixture part is changed in a range from room temperature to 200° C., preferably, the fluctuation of the peak value of the relative emission intensity is within 25%.

Therefore, the present invention takes several aspects as follows.

In a first aspect, a phosphor mixture is provided, which emits a visible light under an excitation of an excitation light of ultraviolet to green color, wherein under the excitation of the excitation light with an wavelength range from 430 nm to 500 nm, a peak value of a relative emission intensity at the temperature of 25° C. is defined as $P_{25}$, and the peak value of the relative emission intensity at the temperature of T° C. is defined as $P_T$, and when the value of T is changed in a range from 25° C. to 200° C., the value of $(100\times(P_{25}-P_T)/P_{25})$ is within ±25.

In a second aspect, the phosphor mixture according to the first aspect is provided, comprising a phosphor expressed by a composition formula $M_mA_aB_bO_oN_n:Z$ (wherein element M is at least one or more kind of element having bivalent valency, element A is at least one or more kind of element having tervalent valency, element B is at least one or more kind of element having tetravalent valency, O is oxygen, N is nitrogen, element Z is at least one or more kind of element acting as an activator in the phosphor, expressed by m=a=b=1, o<0.5, n=3-⅔o.), and at least one or more kind of phosphor having an emission spectrum with an emission peak in the wavelength range from 500 nm to 630 nm, when excited by an excitation light of ultraviolet to green color.

In a third aspect, the phosphor mixture according to the second aspect is provided, wherein the element M is at least one or more kind one kind of element selected from a group consisting of Ca, Mg, Sr, Ba, and Zn, the element A is at least one or more kind of element selected from the group consisting of Al and Ga, the element B is at least one or more kind of element selected from the group consisting of Si and Ge, and the element Z is at least one or more kind kind of element selected from rare earth elements and transition metal elements.

In a fourth aspect, the phosphor mixture according to the third aspect is provided, wherein the element Z is Eu.

In a fifth aspect, the phosphor mixture according to any one of the second aspect to fourth aspect is provided, wherein the phosphor expressed by the composition formula $M_mA_aB_bO_oN_n:Z$ is the phosphor having the composition formula $CaAlSiN_3:Eu$.

In a sixth aspect, the phosphor mixture according to any one of the second aspect to fifth aspect is provided, wherein the phosphor having an emission spectrum with an emission peak in the wavelength range from 500 nm to 630 nm when excited by ultraviolet to green excitation light is the phosphor having a garnet crystal structure with Ce as an activator.

In a seventh aspect, the phosphor mixture according to the sixth aspect is provided, wherein the phosphor having the garnet crystal structure with the Ce as the activator is an Al garnet phosphor containing Y and/or Tb.

In an eighth aspect, the phosphor mixture according to the sixth aspect is provided, wherein the phosphor having the garnet crystal structure with the Ce as the activator is a Si garnet phosphor containing Sc.

In a ninth aspect, the phosphor mixture according to any one of the first aspect to eighth aspect is provided, wherein each of the phosphors is a particle with an average particle size (D50) of 1 to 20 μm.

In a tenth aspect, the phosphor mixture according to any one of the first to ninth aspect is provided, wherein each of the phosphors has the emission spectrum with a half value width of not less than 50 nm.

In an eleventh aspect, the phosphor mixture according to any one of the first aspect to tenth aspect is provided, having two or more emission peaks in the wavelength range from 500 nm to 780 nm and having a continuous spectrum without a break in the wavelength range from 500 nm to 780 nm, in the emission spectrum under an excitation by the excitation light with the wavelength range from 430 nm to 500 nm.

In a twelfth aspect, the phosphor mixture according to any one of the first aspect to eleventh aspect is provided, wherein a chromaticity of the emission spectrum satisfies x>0.2, and y>0.2, in the emission spectrum under the excitation of the excitation light with the wavelength range from 430 nm to 500 nm.

In a thirteenth aspect, a light emitting device is provided, comprising the phosphor mixture according to any one of the first aspect to twelfth aspect, and a light emitting part emitting light with the wavelength range from 430 nm to 500 nm.

In a fourteenth aspect, the light emitting device according to the thirteenth aspect is provided, wherein the light emitting part is a light emitting diode (LED).

In a fifteenth aspect, the light emitting device according to the fourteenth aspect is provided, wherein the light emitting part is a light emitting diode (LED) composed of a material containing Ga.

In a sixteenth aspect, the light emitting device according to any one of the thirteenth aspect to fifteenth aspect is provided, wherein a general color rendering index Ra of the light emitting device is not less than 80.

In a seventeenth aspect, the light emitting device according to any one of the thirteenth aspect to sixteenth aspect is provided, wherein a special color rendering index R9 of the light emitting device is not less than 60.

In an eighteenth aspect, the light emitting device according to any one of the thirteenth aspect to seventeenth aspect is provided, wherein the special color rendering index R15 of the light emitting device is not less than 80.

In an nineteenth aspect, the light emitting device according to any one of the thirteenth aspect to eighteenth aspect is provided, wherein correlated color temperature of the light emitting device is in a range from 7000K to 2500K.

In the phosphor mixture according to the first aspect, little variation is shown in the peak value of the relative emission intensity under the influence of the change in surrounding temperature. Therefore, in the light emitting device using the phosphor mixture, the "color shift" caused by heating the phosphor compound can be suppressed.

In the phosphor mixture according to any one of the second aspect to twelfth aspect, little variation is shown in the peak value of the relative emission intensity under influence of the change in surrounding temperature. Therefore, when the phosphor mixture is irradiated with a predetermined excitation light, the emitted light from the phosphor mixture is synthesized with the excitation light, and the light such as white color is emitted, with excellent color rendering properties, with small color shift under the influence of the surrounding temperature.

The light emitting device according to any one of the thirteenth aspect to nineteenth aspect is the device emitting the light such as white color, with excellent color rendering properties, with small color shift under the influence of the surrounding temperature.

THE PREFERRED EMBODIMENT OF THE INVENTION (Phosphor Mixture According to the Present Invention)

A phosphor mixture according to the present invention emits a visible light under an excitation of an excitation light of ultraviolet to green color in a wavelength range from 430 nm to 500 nm. Under the excitation of the excitation light with the wavelength range from 430 nm to 500 nm, a peak value of a relative emission intensity at the temperature of 25° C. is defined as $P_{25}$, the peak value of the relative emission intensity at the temperature of T° C. is defined as $P_T$, and when the value of T is changed in a range from 25° C. to 200° C., the value of $(100 \times (P_{25}-P_T)/P_{25})$ is within ±25.

In the phosphor mixture with the aforementioned structure, little variation is shown in the emission peak under the influence of change in the surrounding temperature. Therefore, in a light emitting device using the phosphor mixture, variation in the emission intensity due to the heat of each mixed phosphor can be made small, and particularly variation in the light emission intensity can be suppressed even at a high temperature of not less than 100° C. Accordingly, "color shift" caused by the aforementioned variation can be suppressed. As a result, in the light emitting device such as the aforementioned white LED lighting unit, when a large current flows into the LED to obtain a strong emission intensity, the variation in the peak value of the relative emission intensity: $(100(100 \times (P_{25}-P_T)/P_{25})$ is within ±25, even if the temperature of the phosphor mixture exceeds 100° C. Therefore, it appears that the color shift of the phosphor mixture is suppressed, and as a result, the "color shift" of the light emitting device can be suppressed. Specifically, in the phosphor mixture, deterioration in the emission characteristic of the phosphor mixture is small, even when the temperature of the phosphor mixture is increased by heat from outside. Therefore, deterioration in the emission characteristic under the influence of the change in the surrounding temperature hardly occurs. Accordingly, in the light emitting device in which the phosphor mixture and the light emitting part are combined, in order to obtain a strong emission intensity, a large current is allowed to flow into the light emitting part, and even when heat generation occurs in the light emitting part, the light emitting device with small color shift and high luminance can be obtained. Particularly, even when the temperature of the phosphor mixture is increased to 200° C., the deterioration in the emission intensity is within 20%. Therefore, even when a light emission element and an ultraviolet discharge lamp are used as the light emitting part, it seems that the "color shift" due to the remarkable deterioration of the emission intensity in a human visual sense does not occur, and therefore the phosphor mixture of the present invention is suitable as the phosphor used in a light source set for illumination.

The phosphor mixture according to the present invention can be manufactured by combining the phosphor expressed by a composition formula MmAaBbOoNn:Z (wherein element M is at least one or more kind of element having bivalent valency, element A is at least one or more kind of element having tervalent valency, element B is at least one or more kind of element having tetravalent valency, O is oxygen, N is nitrogen, element Z is at least one or more kind of element acting as an activator in the phosphor, satisfying m=a=b=1, o<0.5, n=3-⅔o.), and the phosphor having a garnet crystal structure with Ce as an activator having an emission spectrum with a peak in the wavelength range from 500 nm to 630 nm. Then, the phosphor mixture having the aforementioned structure, has the emission spectrum with a uniform intensity of light over the whole range of the visible light, and emits light with excellent color rendering properties.

(Red Phosphor Included in the Phosphor Mixture According to the Present Invention)

First, explanation will be given to the phosphor, which is a red phosphor included in the phosphor mixture according to the present invention, and expressed by the composition formula MmAaBbOoNn:Z. In the composition formula of the red phosphor, the element M is more than one kind of element having bivalent valency, and preferably is at least one or more kind of element selected from the group consisting of Ca, Mg, Sr, Ba, and Zn. These elements are easily available with small environmental loads. Further, from this viewpoint, Ca is most preferable. The element A is at least one or more kind of element having tervalent valency, and preferably is at least one or more kind of element selected from the group consisting of Al and Ga. These elements are also easily available with small environmental loads. Further, from this viewpoint, Al is most preferable. The element B is at least one or more kind of element having tetravalent valency, and preferably is at least one or more kind kind of element selected from Si and Ge.

These elements are also easily available, with small environmental loads. Further, from this viewpoint, Si is most preferable. The element Z is the element acting as an activator in the phosphor, and preferably is at least one or more kind of element selected from rare earth elements or transitional metal elements. These elements are also easily available, with small environmental loads. Further, from this viewpoint, Eu is most preferable. Also, preferably O is provided in a small amount. Accordingly, the most preferable composition formula of the red phosphor according to the present invention is expressed by $CaAlSiN_3$:Eu.

The red phosphor having the aforementioned structure emits high luminance red light with high efficiency having the emission spectrum with a peak in the wavelength range from 630 nm to 700 nm, when irradiated with the light with the wavelength range from 250 nm to 550 nm as an excitation light. Further, the half value width of the emission spectrum of the red phosphor is not less than 50 nm.

Note that O in the composition formula derives from the oxygen contained in the raw material of the red phosphor when the red phosphor is manufactured. As described above, from the viewpoint of the emission efficiency of the red phosphor, a small amount of O is preferable, and a small negligible amount of O is present in the red phosphor. Therefore, in the composition formula of the red phosphor hereafter, designation of O is sometimes omitted.

(Manufacturing Method of the Red Phosphor Included in the Phosphor Mixture According to the Present Invention)

Here, the manufacture of the phosphor expressed by the composition formula $CaAlSiN_3$:Eu (satisfying Eu/(Ca+Eu) =0.020) will be explained, as an example of the manufacturing method of the red phosphor according to the present invention.

Each of the nitride raw materials of the element M, the element A, and the element B may be made of commercially available materials. However, since high purity is preferable, the nitride raw material of 2N or more is preferably prepared, and further preferably the nitride raw material of 3N or more is prepared. Generally, the particle size of each raw material is preferably fine particles from the viewpoint of accelerating a reaction. However, the particle size and the shape of the phosphor thus obtained are varied, depending on the particle size and the shape of the raw material. Therefore, the nitride raw material may be prepared, having the particle size adjusted nearly corresponding to the particle size required for the phosphor finally obtained. The raw material of the element Z is preferably commercially available nitride raw material or a single metal. However, an amount to be added is small, and therefore no problem is involved in using oxide. However, it is preferable to have a higher purity, and therefore the nitride raw material of 2N or more is preferably prepared, and further preferably the nitride raw material of 3N or more is prepared.

In a case of manufacturing $Ca_{0.980}AlSiN_3$:$Eu_{0.020}$, $Ca_3N_2$ (2N), AlN(3N), $Si_3N_4$(3N) maybe prepared respectively, as the nitride of the element M, the element A, and the element B, and $Eu_2O_3$ (3N) may be prepared as the element Z. The raw materials thus prepared are weighed and mixed, by adjusting the mixing ratio of each raw material at 0.980/3 mol of $Ca_3N_2$, 1 mol of AlN, 1/3 mol of $Si_3N_4$, and 0.020/2 mol of $Eu_2O_3$, respectively, so that a molar ratio of each element satisfies Ca:Al:Si:Eu=0.980:1:1:0.020. Since the $Ca_3N_2$ is easily oxidized, it is convenient to perform the weighing/mixing of each raw material in a glove box under an inert atmosphere. In addition, nitride of each raw material element is easily affected by moisture, and therefore preferably the inert gas from which the moisture is sufficiently removed is used.

Either of a wet type or a dry type may be equally used as a mixing type. However, when pure water is used as a wet-mixing solvent, the raw material is decomposed, and therefore a proper organic solvent needs to be selected. As a device, a usual method using a ball mill and a mortar, and so forth may be used.

The raw material thus mixed is put in a crucible, retained in the inert atmosphere such as nitrogen at 1000° C. or more, preferably at 1400° C. or more, further preferably 1500° C. or more for 30 minutes or more, preferably for 3 hours, and fired. The higher the firing temperature is, the more rapidly the firing is advanced, and the maintaining time is therefore shortened. Meanwhile, even when the firing temperature is low, the target emission characteristics can be obtained by maintaining the temperature for a long time. However, the longer the firing time is, the more rapidly the particle growth is advanced, and the particle size becomes therefore large. Therefore, the firing time may be set in accordance with the target particle size. Pressure during firing under the inert atmosphere is preferably set at 0.5 MPa or less to fire. Firing with the pressure of more than this value allows sintering between particles to advance excessively, and this is not preferable for crushing after firing.

Note that the crucible such as an $Al_2O_3$ crucible, a $Si_3N_4$ crucible, an AlN crucible, a sialon crucible, a C (carbon) crucible, and a BN (boron nitride) crucible with high purity without intrusion of impurities, which can be used in the inert atmosphere, may be used. However, the BN crucible is capable of averting the intrusion of impurities from the crucible and is therefore preferably used.

After the firing is completed, the fired object is taken out from the crucible, and is crushed up to a predetermined average particle size by using crushing means such as the mortar and the ball mill and so forth, to manufacture the phosphor expressed by the composition formula $Ca_{0.980}AlSiN_3$:$Eu_{0.020}$. Here, when $Eu_2O_3$ is used as the Eu raw material, although by a small amount, the oxygen is added. Therefore, the composition formula is expressed by $Ca_{0.980}AlSiO_{0.03}N_{2.96}$:$Eu_{0.020}$. However, an amount of the oxygen is small, and no problem is particularly involved therein. Note that when the amount of the oxygen is further decreased, Eu metal or Eu nitride may be used as the Eu raw material.

When other element is used as the element M, the element A, the element B, and the element Z, and when an amount of activation of the Eu, which is an activator, is changed, the phosphor can be manufactured in the same way as the aforementioned manufacturing method, by adjusting a blending amount at the time of mixing each raw material to a predetermined composition ratio.

When the phosphor mixture according to the present invention is used in a powdery state, the average particle size of each phosphor powder mixed is preferably set at 20 μm or less, respectively. The reason is that since the emission in the phosphor powder is considered to occur mainly on the surface of the powdery particle, the average particle size (D50) of 20 μm or less ensures a surface area per powder unit weight, thereby averting the deterioration in the luminance. Further, in the manufacture of the lighting unit by using the phosphor mixture powder, the phosphor mixture powder is formed into a pasty form, and for example, when the pasty phosphor powder is applied on a light emitting element and so forth, the density of the powder can be increased, and from this viewpoint also, the deterioration in the luminance can be averted. In addition, according to the study of the inventors of the present invention, although a detailed reason is not clarified yet, from the viewpoint of the emission efficiency of the phosphor powder, it was found that the average particle size was preferably larger than 1 μm. As described above, preferably the average particle size of the phosphor powder is 1 μm to 20 μm.

(Emission Characteristic of the Phosphor Mixture According to the Present Invention)

Next, explanation will be given to the phosphor included in the phosphor mixture according to the present invention, having the emission spectrum with a broad peak in the wavelength range from 500 to 630 nm.

The phosphor having the emission spectrum with a maximum peak in the wavelength range from 500 nm to 630 nm is preferable, and preferably the half value width of the emission spectrum is 50 nm or more. Particularly, the phosphor having a garnet crystal structure with Ce as an activator is preferable. This is because the emission spectrum having further improved color rendering properties can be obtained, because the emission efficiency under excitation of the blue light is improved, and the half value width of the emission spectrum is expanded by activating Ce to the garnet crystal structure. Particularly, the phosphor which is a Al garnet phosphor containing Y or Tb, or the phosphor which is a Si garnet phosphor containing Sc, is preferable. The phosphor having the garnet structure such as $Y_3Al_5O_{12}$:Ce, $Tb_3Al_5O_{12}$:Ce, $Ca_3Sc_2Si_3O_{12}$:Ce is given as an example of the aforementioned phosphor. However, if the aforementioned conditions are satisfied, this is not limited thereto.

As described above, preferably all phosphors included in the phosphor mixture of the present invention have the emission spectrum with a half value width of 50 nm or more wavelength. As a result, the phosphor mixture of the present invention has the emission spectrum over the whole region of the visible light of green color to red color, and when the phosphor mixture is irradiated with the excitation light with the wavelength range from 430 nm to 500 nm, the emission spectrum of the phosphor and the emission spectrum of the excitation light are synthesized. Thus, the emission spectrum exhibiting excellent color rendering properties can be obtained.

Next, explanation will be given to a method of obtaining the phosphor mixture according to the present invention by mixing the aforementioned phosphors. By setting a mixing ratio of the phosphors at mixing the phosphor mixture, when the aforementioned phosphor mixture is irradiated with the excitation light with the wavelength range from 430 nm to 500 nm, the correlated color temperature of the emission spectrum can be selected to be a desired value between 7000K to 2500K. Specifically, the emission spectrum of the excitation light with the wavelength range from 430 nm to 500 nm emitted by the light emitting part (such as LED), and the emission spectrum obtained when each of the aforementioned phosphors is excited by the light with the same wavelength as the aforementioned excitation light are measured, the emission spectrum thus obtained is synthesized by simulation, and the mixing ratio of each phosphor for obtaining a desired correlated color temperature may be obtained. Further, in addition to the correlated color temperature, characteristics such as a color rendering index and chromaticity coordinates are obtained. Therefore, adjustment of the mixing ratio of the phosphors may be performed, depending on a target characteristic. Since each of the aforementioned phosphors has the half value width of 50 nm or more, the emission spectrum of the light emitting part are overlapped with each other in the light emission of the phosphor mixture. Then, a continuous, a so-called broad emission spectrum can be obtained, in the wavelength range from 420 nm to 780 nm without steep fluctuation and a break.

Further, by combining the phosphors, the light source for illumination having an improved color rendering properties in the white light with the correlated color temperature of 7000K to 2500K can be manufactured. Even if the correlated color temperature range is out of this range, this does not pose a problem in a device such as an outdoor illumination device. However, when the correlated color temperature is high, a blue-tinged component is increased, and reversely, when the correlated color temperature is excessively low, a red-tinged component is increased. Therefore, the aforementioned light source with the correlated color temperature out of the range is not suitable for the light source requiring high color rendering properties in an indoor environment. Accordingly, the white light with the correlated color temperature of 7000K to 2500K is preferable for the light source obtained by combining the phosphors.

Further, in the emission spectrum under the excitation of the excitation light with the wavelength range from 430 nm to 500 nm, by setting the chromaticity of the emission spectrum of the phosphor mixture, satisfying x>0.2 and y>0.2 (where x and y are chromaticity (x, y) obtained by a calculation method defined by JIS Z 8701), red component is increased as an emission color, and therefore the red phosphor with better efficiency can be used, the emission color is prevented from being close to a single color such as the blue color and the green color, and therefore the white LED lighting unit with more improved efficiency can be manufactured. Such a white LED lighting unit also is suitable for a backlight light source for a display.

(Variation in the Emission Intensity Due to the Temperature of the Phosphor Mixture According to the Present Invention)

Explanation will be given to the measurement of the emission intensity $P_{25}$ and $P_T$ of the phosphor mixture of the present invention at the temperature of 25° C. and T° C., and the variation in the emission intensity.

As for the emission intensity $P_{25}$, the phosphor is placed in an environment of 25° C., and the spectrum of the light emitted by the phosphor mixture when irradiated with the excitation light with a predetermined wavelength as will be described later is measured, and the peak having a maximum intensity in the spectrum thus measured is defined as a maximum peak, and the value of the relative intensity of the peak is defined as $P_{25}$. Next, as for the emission intensity $P_T$, the phosphor mixture is placed in an environment of T° C., and the emission spectrum under the excitation of the same excitation light as that in the environment of 25° C. is measured. The relative intensity of the peak corresponding to the peak defined as the maximum peak in the environment of 25° C. is obtained in the emission spectrum, and the value thus obtained is defined as $P_T$. From $P_{25}$ and $P_T$ thus obtained, the value of $(100 \times (P_{25} - P_T)/P_{25})$ is calculated.

In the excitation light to irradiate, necessary predetermined wavelengths may be determined as needed in the wavelength range from 430 nm to 500 nm. The point to determine the wavelength range of the excitation light is that the wavelength range of the excitation light is adjusted to that of the ultraviolet discharge lamp and the LED or the like which are combined with the phosphor mixture as an excitation light source.

By combining the phosphor mixture according to the present invention in powdery state with the light emitting part emitting the light with the wavelength range from 430 nm to 500 nm, preferably wavelength range from 440 nm to 480 nm, various kinds of illumination devices can be manufactured.

As the light emitting part, an LED light emitting element emitting blue light, or a discharge lamp emitting blue light are given as examples. Then, when the phosphor mixture according to the present invention is combined with the LED light emitting element, various kinds of illumination devices can be manufactured. Also, when the phosphor mixture according to the present invention is combined with the discharge lamp, various fluorescent lamps and illumination devices or the like can be manufactured.

(Combination of the Phosphor Mixture According to the Present Invention and the Light Emitting Part)

As for the method of combining the phosphor mixture according to the present invention and the light emitting part, a publicly-known method may be used. However, in the light emitting device using the LED in the light emitting part, the light emitting device can be manufactured as follows.

The light emitting device using the LED in the light emitting part will be explained with reference to the drawings hereafter.

Figure 5A:
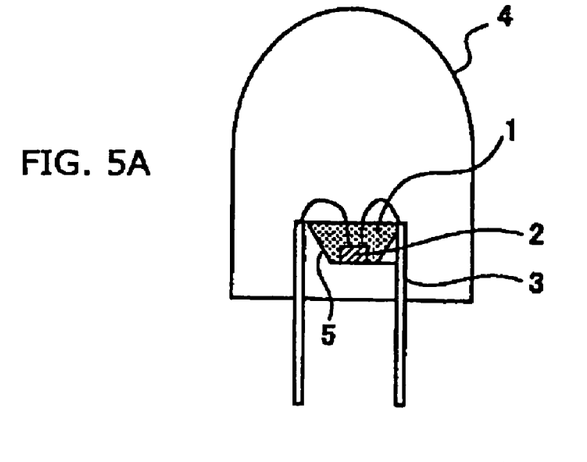
FIG. 5 is a sectional view showing a general type LED light emitting device according to an example.
Figure 5B:
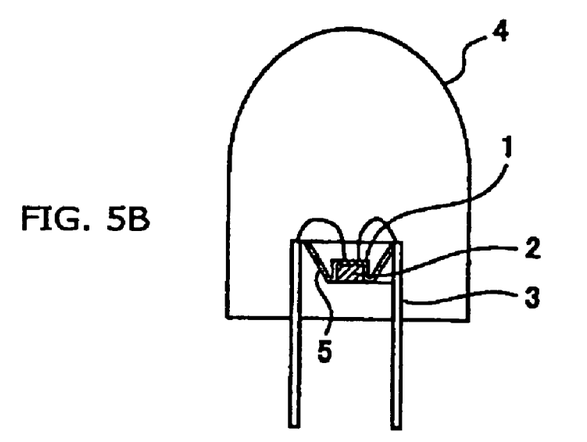
Figure 5C:
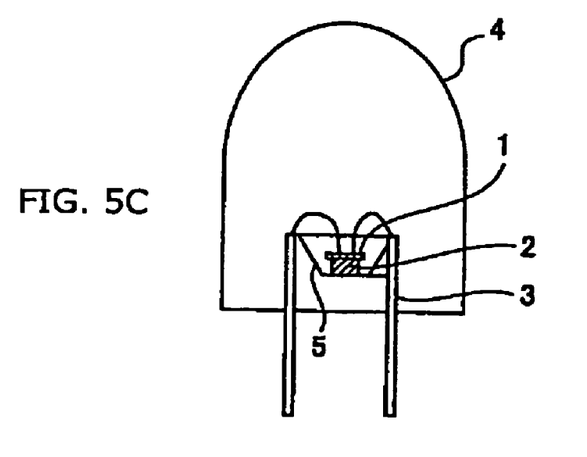

FIGS. 5A to 5C are schematic sectional views of a standard type LED light emitting device, and FIGS. 6A to 6E are schematic sectional views of a reflection type LED light emitting device. Note that in each view, the corresponding parts are designated by the same signs and numerals, and explanation is omitted in some cases.

First, by using FIG. 5A, explanation will be given to an example of the light emitting device using the LED in the light emitting part, and is combined with the phosphor mixture according to the present invention.

In the standard type LED light emitting device, an LED light emitting element 2 is installed in a cup-formed container 5 provided on a tip end of a lead frame 3. In the present embodiment, the phosphor mixture according to the present invention or a mixture obtained by dispersing the phosphor mixture into a transparent resin such as silicon and epoxy (referred to as phosphor mixture 1 hereafter) are filled in a whole part of the cup-formed container 5, and the LED light emitting element 2 is thereby embedded, so that the phosphor mixture 1 is molded by a transmittable resin 4 together with a part of the lead frame 3 and the cup-formed container 5.

Next, a different mode of the light emitting device will be explained by using FIG. 5B.

In the embodiment, the phosphor mixture 1 is applied on the cup-formed container 5 and an upper surface of the light emitting element 2.

Next, further different mode of the light emitting device will be explained by using FIG. 5C.

In this embodiment, the phosphor mixture 1 is placed on an upper part of the LED light emitting element 2.

As described above, in the standard type LED light emitting device explained by using FIG. 5A to FIG. 5C, the light is released upward from the light emitting element 2. However, even if the light is released downward, the light emitting device can be formed in the same method. For example, the reflection type light emitting device is formed in such a manner that a reflection surface and a reflection plate are disposed in a releasing direction of the light emitted by the LED light emitting element and the light released from the element is made to reflect by the reflection surface so as to be emitted outside. Here, by using FIGS. 6A to 6E, explanation will be given to the reflection type LED light emitting device to which the phosphor mixture according to the present invention is applied.

Figure 6A:
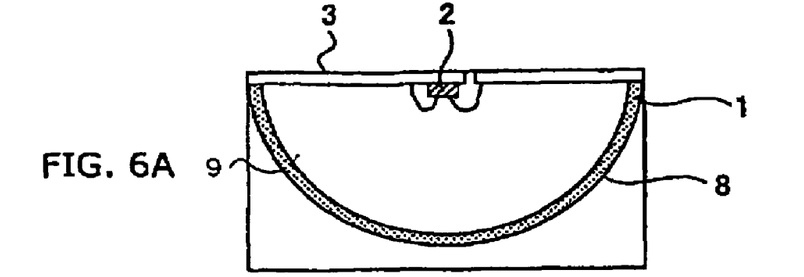
FIG. 6 is a sectional view showing a reflection type LED light emitting device according to an example.

First, by using FIG. 6A, explanation will be given to an example of the light emitting device which uses the LED in the light emitting part, and which is combined with the phosphor mixture according to the present invention.

In the reflection type LED light emitting device, the LED light emitting element 2 is installed at the tip end of one of the lead frames 3, the light emitted from the light emitting element is directed downward, reflected by a reflection surface 8, and released upward. In this embodiment, the phosphor mixture 1 is applied on the reflection surface 8. Note that in some cases, in a grooved portion formed by the reflection surface 8, a transparent molding material 9 for protecting the light emitting element 2 is filled.

Figure 6B:
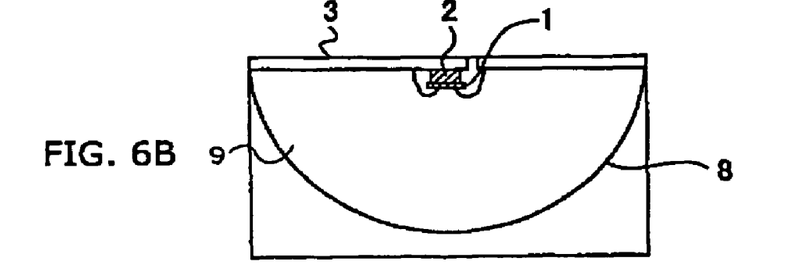

Next, an example of a different mode of the light emitting device will be explained by using FIG. 6B.

In this embodiment, the phosphor mixture 1 is installed in a lower part of the LED light emitting element 2.

Figure 6C:
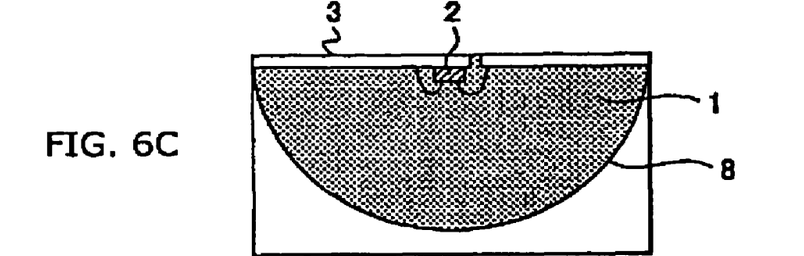

Next, an example of the different mode of the light emitting device will be explained by using FIG. 6C.

In this embodiment, the phosphor mixture 1 is filled in the grooved portion formed by-the reflection surface 8.

Figure 6D:
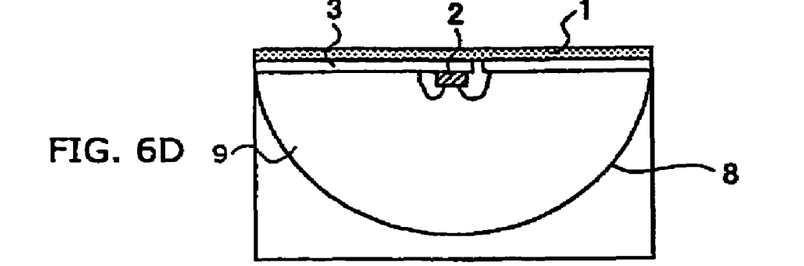

Next, an example of the different mode of the light emitting device will be explained by using FIG. 6D.

In this embodiment, the phosphor mixture 1 is applied on an upper part of the transparent molding material 9 for protecting the LED light emitting element 2.

Figure 6E:
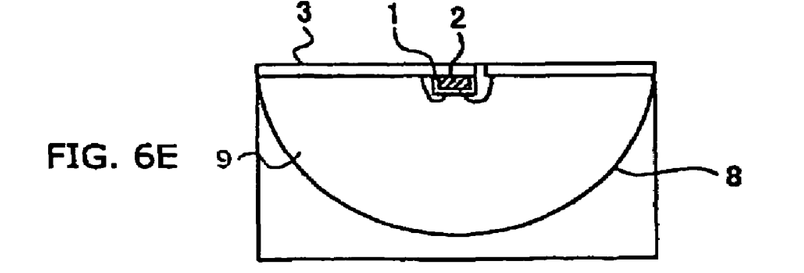

Next, an example of the different mode of the light emitting device will be explained by using FIG. 6E.

In this embodiment, the phosphor mixture 1 is applied on the surface of the LED light emitting element 2.

The standard type LED light emitting device and the reflection type LED light emitting device may be appropriately used in accordance with application. However, the reflection type LED light emitting device has advantages that it can be made thin, a light emitting area can be made large, and a utilization efficiency of light can be improved.

When the light emitting device as described above is used as a light source for a general lighting unit, the light emitting device is required to have the emission spectrum having excellent color rendering properties. Therefore, the color rendering properties of the light emitting device incorporating the phosphor mixture according to the present invention is measured, based on an evaluation method regulated by the JIS Z 8726. As a result, it is found that the light emitting device serves as an excellent light source, by setting the general color rendering index Ra at 80 or more in the evaluation of the JIS Z 8726. Moreover, the light emitting device serves as a significantly excellent light source, preferably by setting the special color rendering index R9, which is an index showing a red component, at 60 or more, and further preferably by setting the special color rendering index R15 at 80 or more, which is an index showing a flesh color of Japanese women.

Therefore, the light emitting device was manufactured, in which the phosphor mixture was irradiated with the light from the light emitting part emitting the light having the emission spectrum with the wavelength range from 430 nm to 500 nm, and the phosphor mixture emits light. Note that as the light emitting part, a blue emitting diode (LED) constituted of a material containing Ga was used.

The color rendering properties of the light emitted by the light emitting device was evaluated. As a result, it was found that the light emitting device incorporating the phosphor mixture of the present invention was capable of easily exhibiting the chromaticity of the emission spectrum satisfying x>0.2 and y>0.2, and the color rendering properties of 80 or more of Ra, 60 or more of R9, and 80 or more of R15 in the correlated color temperature in a range from 7000K to 2500K, and served as a significantly excellent light source.

Further, in the phosphor mixture according to the present invention, by properly changing the blending ratio of each phosphor, emission colors of various color tones which have not been obtained heretofore was obtained.

EXAMPLE

The present invention will be specifically explained based on examples.

Example 1

Figure 1:
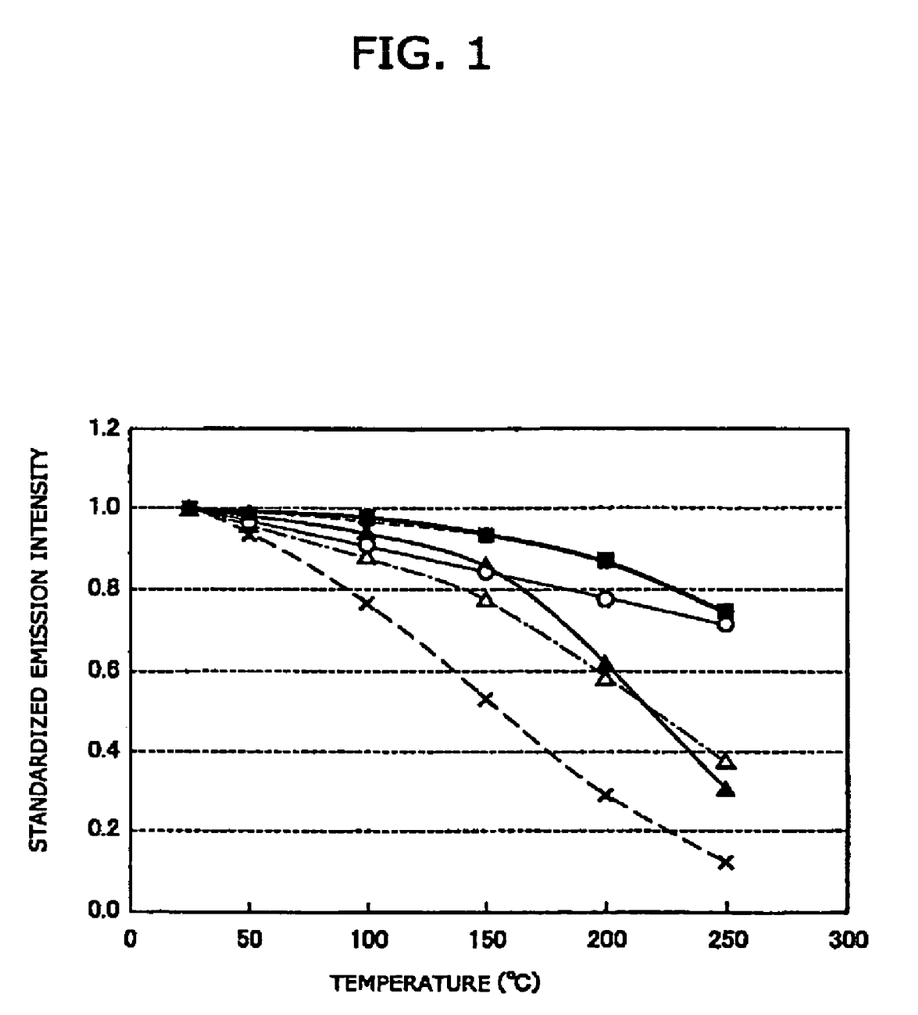
FIG. 1 is a view of an evaluation result of a temperature characteristic of an emission intensity of a phosphor sample.

1) Manufacture of the Phosphor and Temperature Characteristic Evaluation of the Phosphor By the method explained in the examples, each raw material was weighed, with the mixing ratio set to be 0.980/3 mol of $Ca_3N_2$, 1 mol of AlN, 1/3 mol of $Si_3N_4$, and 0.020/2mol of $Eu_2O_3$, and mixed in a glove-box filled with nitrogen gas. Then, the raw materials thus mixed was fired for 3 hours at 1600° C. in a nitrogen atmosphere of 0.05 MPa, and the red phosphor $CaAlSiN_3$:Eu (sample 1) of the present invention was thus manufactured. The emission intensity at 25° C. under the excitation of the light with 467 nm wavelength was measured, and the emission intensity thus obtained was defined as $P_{25}$. Next, the light emission intensity at T° C. under the excitation of the light with the same 467 nm wavelength was measured, and the emission intensity thus obtained was defined as $P_T$. The temperature characteristic of the variation in the emission intensity ($100\times(P_{25}-P_T)/P_{25}$ was shown in table 1. Further, the evaluation result of the temperature characteristic was shown in FIG. 1. FIG. 1 is a graph, with the emission intensity of the sample expressed by the relative intensity, showing the value obtained by standardizing the emission intensity at 25° C. as 1 in the ordinate, and showing the temperature of the sample in the abscissa, and the value of the sample $P_T/P_{25}$ is plotted by ■, and plotted dots are connected by a thick solid line.

Next, the publicly-known yellow phosphor $Y_3Al_5O_{12}$:Ce (Sample 2) was manufactured as follows. Each raw material was measured in 2.94/2 mol of $Y_2O_3$ and 5/2 mol of $Al_2O_3$ and 0.06 mol of $CeO_2$, and then mixed in a mortar, put the raw materials thus mixed in a crucible, retained in a nitrogen atmosphere at 1400° C. for 3 hours, fired, and $Y_3Al_5O_{12}$:Ce (Sample 2) was thereby manufactured.

The sample 2 thus manufactured is generally called YAG:Ce phosphor, which is the phosphor having the emission spectrum with a maximum peak in the wavelength range from 500 nm to 630 nm, and having a garnet crystal structure with Ce as an activator. The YAG:Ce phosphor includes the phosphor in which Y is slightly replaced with Gd, and Al is slightly replaced with Ga. However, in this example, $Y_3Al_5O_{12}$:Ce not containing Ga and Gd was prepared as the sample 2. (The $Y_3Al_5O_{12}$:Ce is described as YAG:Ce hereafter in some cases.)

Further, each raw material was weighed, with the mixing ratio set to be 2.94 mol of $CaCO_3$, 2/2 mol of $Sc_2O_3$, 3 mol of $SiO_2$, and 0.06 mol of $CeO_2$, and then, in the same way as that of the sample 2, fired at 1400° C. for 3 hours in the nitrogen atmosphere, and the publicly-known green phosphor $Ca_3Sc_2Si_3O_{12}$:Ce (Sample 3) was thereby manufactured.

In the samples 2 and 3 thus manufactured, in the same way as the sample 1, the temperature characteristic ($100\times(P_{25}-P_T)/P_{25}$) of the variation in the emission intensity was measured, and the measurement result was shown in table 1. Further, in the same way as the sample 1, the value of $P_T/P_{25}$ at the temperature of each sample is plotted by ♦ in the sample 2, and plotted by ○ in the sample 3, and the plotted dots thus obtained are connected by a short broken line in the sample 2, and by a thin solid line in the sample 3.

2) Adjusting Method of The Phosphor Mixture

A manufacturing method of the phosphor mixture including the red phosphor $CaAlSiN_3$:Eu (sample 1) and YAG:Ce (sample 2) will be explained.

First, the emission spectra of the $CaAlSiN_3$:Eu (sample 1) and YAG:Ce (sample 2) under the excitation of the excitation light with 467 nm wavelength were respectively measured, and further the emission spectrum (emission spectrum of the light emitting part) of the excitation light was measured, and a relative mixing ratio of each phosphor, in which the correlated color temperature shown by the phosphor mixture becomes 4500K, was obtained from the emission spectrum by simulation. Based on the result of the simulation, each phosphor was measured and mixed, and the phosphor mixture was thereby obtained. Note that in the example 1, each phosphor was mixed in the mixing ratio of YAG:Ce (sample 2): $CaAlSiN_3$:Eu (sample 1)=95:5.

However, depending on the emission wavelength (excitation wavelength of the phosphor mixture) of the light emitting part and the emission efficiency of the phosphor in the emission wavelength, in some cases, an actually preferable mixing ratio is deviated from the mixing ratio obtained by the result of the simulation. Also, depending on the mixing ratio with resin, a coating method applied to the light emitting device, and a coating thickness, the actually preferable mixing ratio is deviated from the mixing ratio obtained by the result of the simulation. In this case, by properly adjusting the mixing ratio of the phosphor, actual shape of emission spectrum may be adjusted.

Here, when the phosphor was excited by the excitation light of 467 nm wavelength, the half value width of the emission spectrum of the $CaAlSiN_3$:Eu (sample 1) was 86.7 nm, and the half value width of the emission spectrum of the YAG:Ce (sample 2) was 114.7 nm, which are all not less than 50 nm.

3) Evaluation of the Temperature Characteristic of the Phosphor Mixture

The temperature characteristic of the phosphor mixture mixing the samples 1 and 2 under the excitation of the light of 467 nm wavelength was evaluated.

Figure 2:
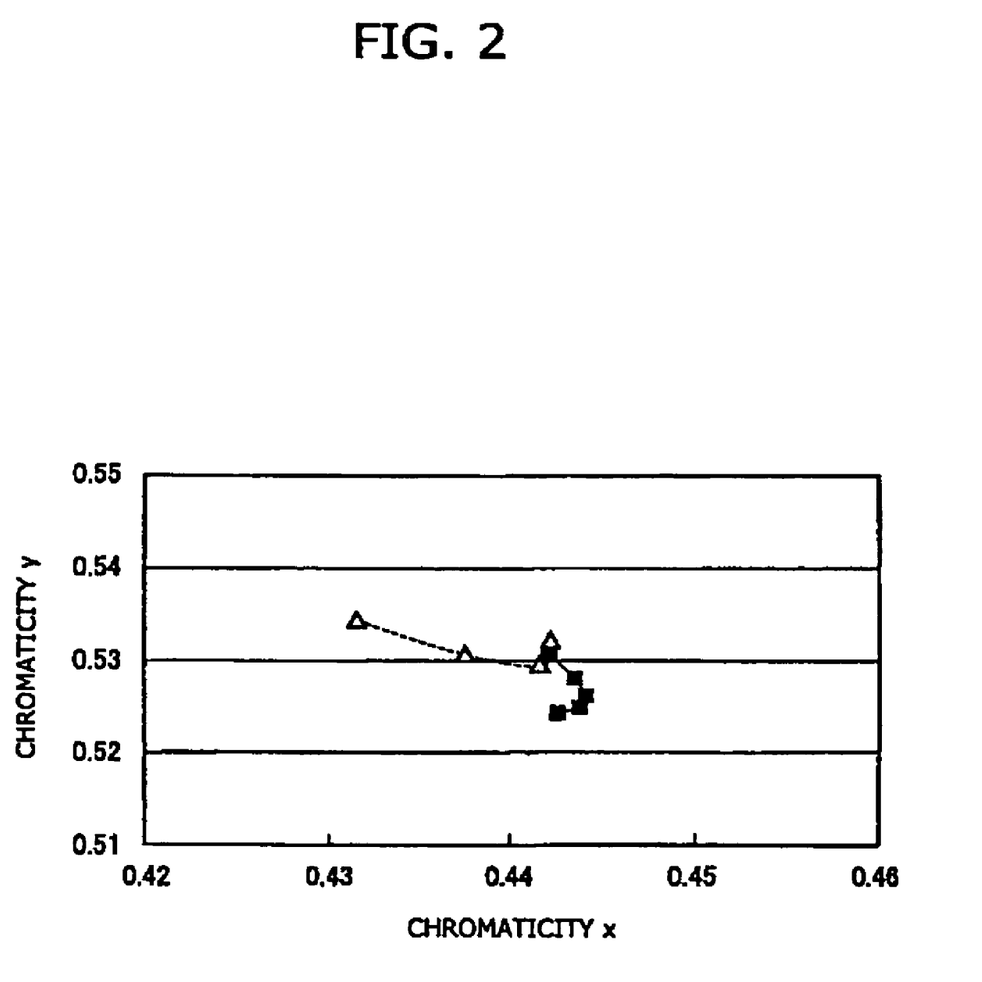
FIG. 2 is a view of the temperature characteristic of a color change in an emission spectrum of the phosphor mixture.

First, variation in the chromaticity in the emission spectrum of the phosphor mixture in each temperature was evaluated. The result is shown in table 2, and described in FIG. 2. FIG. 2 is a graph showing chromaticity y in the ordinate and showing chromaticity x in the abscissa, wherein the value of the chromaticity (x, y) of the phosphor mixture at 50° C. to 250° C. is plotted by using ■, and the plotted dots are connected by a solid line.

4) Evaluation of the Light Emission Characteristic in the Light Emitting Device

The phosphor mixture mixing the samples 1 and 2, and a silicon resin were mixed, which were then applied on the LED releasing the light of 467 nm wavelength, so that the coating thickness became uniform, and the light emitting device releasing the light of white color was manufactured. Depending on the mixing ratio of the resin and the phosphor mixture and an amount of coating, the emission intensity and the chromaticity were different. Therefore, the mixing ratio of the phosphor mixture and the silicon resin may be properly adjusted to a target chromaticity. In this example, the phosphor mixture and the silicon resin were mixed in a weight ratio of 10:3, which was then applied on the LED element.

Figure 4:
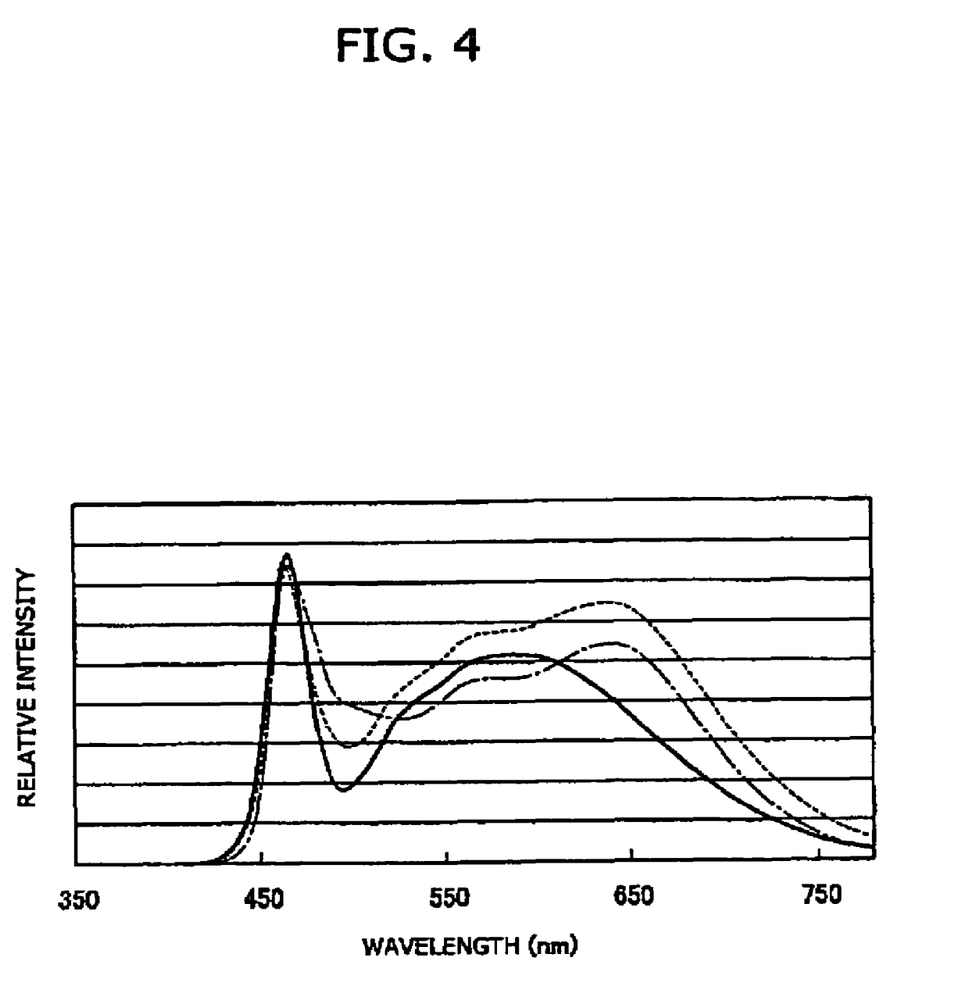
FIG. 4 is a view of the emission spectrum of the light emitting device incorporating the phosphor mixture.

An electric current of DC 20.0 mA was run through the LED, and the correlated color temperature of the emission spectrum of the light emitting device was measured, to obtain the value of 4367K. Then, it was found that the light emitting device had the emission spectrum with an approximately target correlated color temperature. Further, the chromaticity of the emission spectrum was measured to obtain the value of x=0.3648 and y=0.3638. The emission spectrum thus obtained is shown by a solid line in FIG. 4. Note that FIG. 4 is a graph, wherein the light emission intensity is shown in the ordinate as the relative intensity, and the wavelength of the light is shown in the abscissa.

5) Evaluation of the Color Rendering Properties in the Light Emitting Device

Based on the JIS Z 8726, the evaluation of the color rendering properties in the light emission of the light emitting device was performed. As a result, the general color rendering index Ra was 91, the special color rendering index R9 was 92, R10 was 95, R11 was 84, R12 was 67, R13 was 98, R14 was 98, and R15 was 92.

Figure 3:
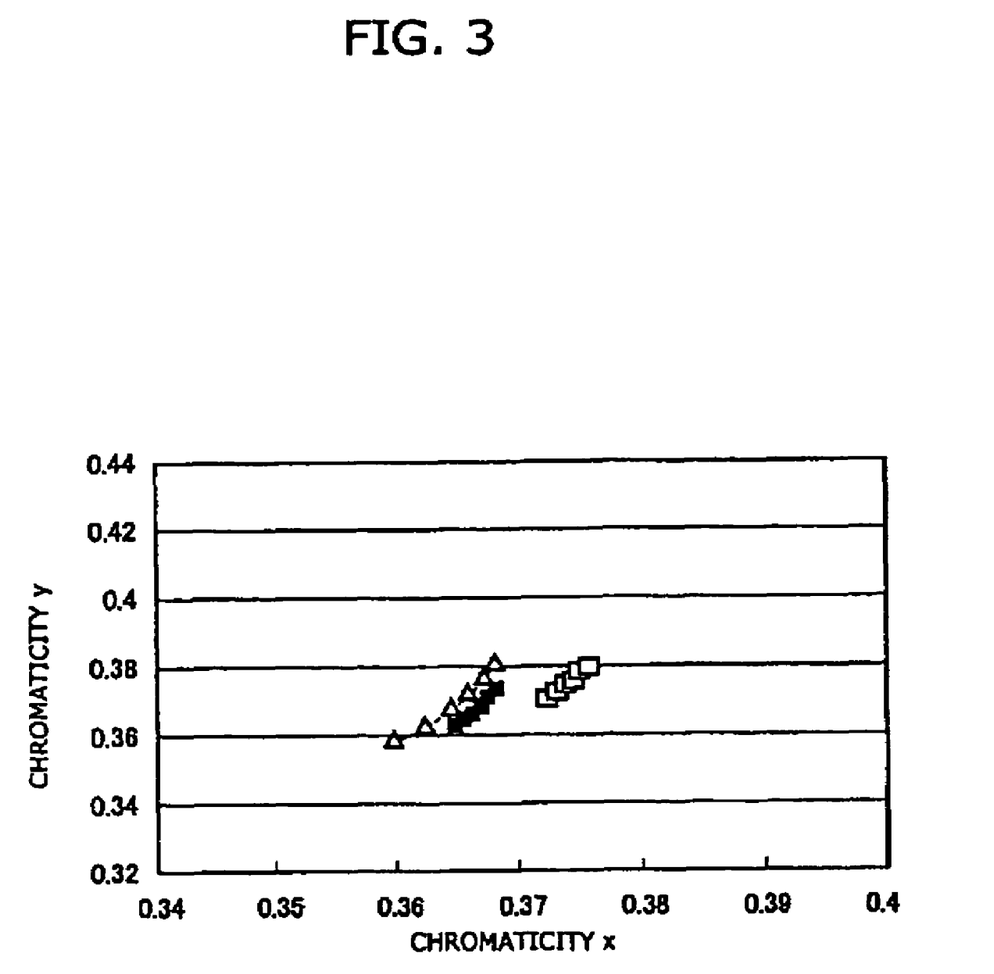
FIG. 3 is a view of a current dependency characteristic of the color change in the emission spectrum of a light emitting device incorporating the phosphor mixture.

6) Evaluation of the Color Shift Caused by a Feeding Current to the Light Emitting Device The current of DC 2.0 mA to 24.0 mA was run to the LED of the light emitting device thus manufactured, and the color shift to the feeding current was evaluated. The evaluation result is shown in table 3, and described in FIG. 3. FIG. 3 is a graph showing the chromaticity x in the ordinate, and showing the chromaticity y in the abscissa, and the value of the chromaticity of the light emission is plotted by using ■ when currents of 5.0 mA, 10.0 mA, 15.0 mA, 20.0 mA, and 24.0 mA were fed to the LED of the light emitting device thus manufacture, and the plotted dots are connected by a solid line.

Comparative Example 1

1) Manufacture of the Phosphor and Evaluation of the Temperature Characteristic of the Phosphor In the same way as the sample 1, each raw material was measured in the composition ratio of 0.585/3 mol of $Ca_3N_2$, 1.365/3 mol of $Sr_3N_2$, 5/3 mol of $Si_3N_4$, and 0.050/2 mol of $Eu_2O_3$, and a raw material mixture mixed in the glove box in the inert gas was put in the crucible, then retained in the inert atmosphere such as nitrogen at 1500° C. for 3 hours, and fired, and the red phosphor $(Ca_{0.3}Sr_{0.7})_2Si_5N_8$:Eu (sample 4) was thereby manufactured.

Here, the red phosphor (sample 4) of $(Ca_{0.3}Sr_{0.7})_2Si_5N_8$:Eu according to the comparative example corresponds to the red phosphor described in the patent documents 1 and 2.

In the sample 4, the sample, in which a molar ratio of Ca and Sr was changed, was manufactured under the same manufacturing condition as that of the sample 4, with a blending composition ratio of $Ca_3N_2$ and $Sr_3N_2$ serving as the raw materials changed, to thereby manufacture the sample having the composition formula $Ca_2Si_5N_8$:Eu (sample 5), and $Sr_2Si_5N_8$:Eu (sample 6).

In regards to the sample thus manufactured, in the same way as the example 1, the emission intensity $P_T$ at T° C. and the emission intensity $P_{25}$ at 25° C. were measured under the excitation of the light of the 467 nm wavelength, and further the ratio $(100\times(P_{25}-P_T)/P_{25})$ of the change in the emission intensity was calculated, and the result was shown in table 1. Further, the value of $P_T/P_{25}$ at the temperature of each sample was plotted in FIG. 1, by using ▲ for the sample 4, x for the sample 5, and Δ for the sample 6, and the plotted dots are connected by a solid line for the sample 4, a long broken line for the sample 5, and one-dot chain line for the sample 6.

2) Adjustment Method of the Phosphor Mixture

The temperature characteristics among the Samples 4 to 6 were compared. Then, it was found that the phosphor mixture of the sample 4 $(Ca_{0.3}Sr_{0.7})_2Si_5N_8$:Eu exhibited a best temperature characteristic, and therefore, the phosphor mixture of the sample 4 was used for the evaluation of comparison with the example 1. The half value width of the emission spectrum of the sample 4 was 82.3 nm, which was not less than 50 nm.

First, in the same way as the example 1, the emission spectra of the $(Ca_{0.3}Sr_{0.7})_2Si_5N_8$:Eu sample 4 and the YAG:Ce sample 2 were respectively measured, under the excitation of the excitation light of 467 nm wavelength, and further the emission spectrum of the excitation light was measured, and from the emission spectra thus obtained, the relative mixing ratio of the sample 4 and the sample 2 was obtained by simulation, so that the correlated color temperature of synthesized light obtained by synthesizing the light emitted from the phosphor mixture and the excitation light was 4500K. Based on the result thus obtained, each phosphor was measured and mixed, and the phosphor mixture was obtained. Note that in this example 1, each phosphor was mixed in the mixing ratio of YAG:Ce (sample 2): $(Ca_{0.3}Sr_{0.7})_2Si_5N_8$:Eu (sample 4)=90:10.

3) Evaluation of the Temperature Characteristic of the Phosphor Mixture

In regards to the phosphor mixture obtained by mixing each phosphor, the temperature characteristic under the excitation of the light of 467 nm wavelength was evaluated.

In the same way as the example 1, the variation in the chromaticity in the emission spectrum of the phosphor mixture was evaluated. The result was shown in table 2, and described in FIG. 2. In FIG. 2, the chromaticity (x. y) of the phosphor mixture at room temperature of 50° C. to 250° C. was plotted by using Δ, and the plotted dots were connected by a broken line.

4) Evaluation of the Emission Characteristic in the Light Emitting Device

The phosphor mixture, in which the samples 4 and 2 were mixed, and the silicon resin were mixed, and in the same way as the example 1, the light emitting device releasing the white light was manufactured.

The current of DC 20.0 mA was run through the LED, and when the correlated color temperature of synthesized light obtained by synthesizing the light emitted from the phosphor mixture and the excitation light was measured, it was 4420K, and it was found that the light emitting device had the emission spectrum with approximately a target correlated color temperature. Further, when the chromaticity of the emission spectrum thus obtained was measured, it was x=0.3616, and y=0.3606. The emission spectrum thus obtained was shown by a broken line in FIG. 4. Note that FIG. 4 is a graph in which the emission intensity is taken in ordinate, as the relative intensity, and the wavelength of the light is taken in abscissa.

5) Evaluation of the Color Rendering Properties in the Light Emitting Device

Based on the JIS Z 8726, the color rendering properties in the light emission of the light emitting device was evaluated.

The general color rendering index Ra was 85, the special color rendering index R9 was 41, R10 was 91, R11 was 70, R12 was 57, R13 was 91, R14 was 97, and R15 was 83.

6) Evaluation of the Color Shift due to the Current Running Through the Light Emitting Device The currents of DC 2.0 mA to 24.0 mA were run through the light emitting device thus manufactured, and the color shift to the current was evaluated. The evaluation result was shown in table 4, and plotted by using Δ a in FIG. 3, and the plotted dots were connected by a broken line.

TABLE 1

|  | COMPOSITION FORMULA | RELATIVE EMISSION INTENSITY | | | | | |
|---|---|---|---|---|---|---|---|
|  |  | 25° C. (REFERENCE VALUE) | 50° C. | 100° C. | 150° C. | 200° C. | 250° C. |
| SAMPLE 1 | $CaAlSiN_3:Eu$ | 1.00 | 0.98 | 0.98 | 0.93 | 0.87 | 0.74 |
| SAMPLE 2 | $Y_3Al_5O_{12}:Ce$ | 1.00 | 0.99 | 0.96 | 0.93 | 0.86 | 0.74 |
| SAMPLE 3 | $Ca_3Sc_2Si_3O_{12}:Ce$ | 1.00 | 0.96 | 0.90 | 0.84 | 0.78 | 0.72 |
| SAMPLE 4 | $(Ca_{0.3}Sr_{0.7})_2Si_5N_8:Eu$ | 1.00 | 0.98 | 0.93 | 0.85 | 0.62 | 0.31 |
| SAMPLE 5 | $Ca_2Si_5N_8:Eu$ | 1.00 | 0.93 | 0.76 | 0.53 | 0.29 | 0.12 |
| SAMPLE 6 | $Sr_2Si_5N_8:Eu$ | 1.00 | 0.95 | 0.88 | 0.77 | 0.58 | 0.38 |

TABLE 2

| SAMPLE TEMEPRATURE | EXAMPLE 1 | | COMPARATIVE EXAMPLE 1 | |
|---|---|---|---|---|
| (° C.) | x | y | x | y |
| 50 | 0.442 | 0.531 | 0.442 | 0.532 |
| 100 | 0.444 | 0.528 | 0.442 | 0.530 |
| 150 | 0.444 | 0.526 | 0.442 | 0.529 |
| 200 | 0.444 | 0.525 | 0.438 | 0.531 |
| 250 | 0.443 | 0.524 | 0.432 | 0.534 |

TABLE 3

| FEEDING CURRENT | SURFACE TEMPERATURE | CHROMATICITY | |
|---|---|---|---|
| (mA) | (° C.) | x | y |
| 24.0 | 47.0 | 0.365 | 0.363 |
| 20.0 | 43.3 | 0.366 | 0.365 |
| 15.0 | 38.2 | 0.366 | 0.366 |
| 10.0 | 33.5 | 0.367 | 0.369 |
| 5.0 | 28.0 | 0.368 | 0.371 |
| 2.0 | 24.8 | 0.368 | 0.374 |

TABLE 4

| FEEDING CURRENT | SURFACE TEMPERATURE | CHROMATICITY | |
|---|---|---|---|
| (mA) | (° C.) | x | y |
| 24.0 | 46.0 | 0.362 | 0.361 |
| 20.0 | 42.0 | 0.362 | 0.363 |
| 15.0 | 37.0 | 0.365 | 0.368 |
| 10.0 | 33.0 | 0.366 | 0.372 |
| 5.0 | 28.0 | 0.367 | 0.377 |
| 2.0 | 25.0 | 0.368 | 0.381 |

Comparison Between the Example 1 and the Comparative Example 1

1) Comparison of the Temperature Characteristic of the Phosphor

The color shift of the phosphor mixture at an external temperature was compared. As obviously shown in FIG. 2, in the example 1, the shift of color occurs by a small degree in a direction of y, in association with the increase in the temperature. Meanwhile, in the comparative example 1, the fluctuation of the chromaticity x in a minus direction is increased, when the temperature is increased to 150° C. or more. This is because, as shown in FIG. 1, the emission intensity at the temperature of the sample 4 is drastically decreased at 150° C. or more, and therefore red component is insufficient, and color shift occurs in a direction of yellow color and green color.

2. Comparison in the Color Rendering Properties

The color rendering properties were compared, in the phosphor mixture shown in the example 1 and the light emitting device using the phosphor mixture described in the comparative example 1. Then, it was found that the light emitting device using the phosphor mixture shown in the example 1 exhibited an improved value of R9 showing a red color rendering property. Accordingly, even when the correlated color temperature is the same, a white light source with better color rendering properties can be obtained.

3. Comparison in the Relative Emission Luminance

The phosphor mixture of the example 1 and the phosphor mixture of the comparative example 1 have approximately the same chromaticity and correlated color temperature. Therefore, the luminance is used as a parameter of the comparison of both, and based on the standardization by the blue light, thereby canceling a difference of luminance due to the light emission element, the light emitting device of the example 1 and the light emitting device of the comparative example 1 were compared in the relative emission luminance. Then, it was found that the light emitting device of the example 1 had a 15% higher luminance than the light emitting device of the comparative example 1. Specifically, the light emitting device of the example 1 had a 15% better emission efficiency than the conventional light emitting device, and the light emitting device capable of displaying bright images could be obtained.

4. Comparison of the Color Shift due to a Feeding Current to the Light Emitting Device In regards to the color shift of the light emission of the light emitting device, which depends on the feeding current to the light emitting element (LED) incorporated in the light emitting device of the example 1 and the comparative example 1, as obvious from FIG. 3, both of the chromaticity x and chromaticity y are shifted toward the minus direction, in association with the increase in the feeding current in each case of the example 1 and the comparative example 1. This is because the temperature of the phosphor mixture is increased due to the heat generation of the light emission element, thereby causing a decrease in the emission intensity, and therefore blue emission, which is the excitation wavelength, becomes relatively strong, resulting in the color change toward blue color side. Here, the color shift of the example 1 is smaller than that of the comparative example 1. Although depending on a heat release structure around the light emission element, from the result of the color shift under the influence of the phosphor mixture itself and the color shift caused by a dependence on the current of the light emitting device incorporating the phosphor mixture therein, a large change in the color shift occurs in the phosphor mixture and further in the light emitting device, in association with the increase in the temperature of the light emission element in the light emitting device. Then, it was found that the light emitting device of the example 1 had a smaller color shift than that of the light emitting device of the comparative example 1, thereby exhibiting an excellent condition.

Example 2

1) Adjusting Method of the Phosphor Mixture

Explanation is given to the manufacturing method of the phosphor mixture using the red phosphor $CaAlSiN_3$:Eu (sample 1) and the phosphor $Ca_3Sc_2Si_3O_{12}$:Ce (sample 3) having the emission spectrum with a maximum peak in the wavelength range from 500 nm to 630 nm and having a garnet crystal structure with Ce as an activator.

The emission spectra of the phosphor $CaAlSiN_3$:Eu (sample 1) and the phosphor $Ca_3Sc_2Si_3O_{12}$:Ce (sample 3) under the excitation of the excitation light of 467 nm wavelength were respectively measured, and further, the emission spectrum (an emission spectrum of the light emitting part) of the excitation light was measured. From such two kinds of emission spectra, the relative mixing ratio of each phosphor was obtained by simulation, so that the correlated color temperature obtained by synthesizing the light emitted from the phosphor mixture and the excitation light was 4500K. Based on the result of this simulation, each phosphor was weighed and mixed to obtain the phosphor mixture. In this example 2, each phosphor was mixed in a mixing ratio of $Ca_3Sc_2Si_3O_{12}$:Ce (sample 3): $CaAlSiN_3$:Eu (sample 1)=93:7.

However, depending on the emission wavelength (excitation wavelength of the phosphor mixture) of the light emitting part and the emission efficiency of the phosphor in the emission wavelength, actually preferable mixing ratio is sometimes deviated from the mixing ratio obtained as a result of the simulation. Also, the actually preferable mixing ratio is sometimes deviated from the mixing ratio obtained as a result of the simulation, depending on the mixing ratio of the phosphor and resin, a method for coating the light emitting device, and the coating thickness. In this case, by properly adjusting the mixing ratio of the phosphor, the shape of the actual emission spectrum may be adjusted.

Here, under the excitation of the excitation light of 467 nm wavelength, the half value width of the emission spectrum of the $Ca_3Sc_2Si_3O_{12}$:Ce (sample 3) was 99.3 nm, all satisfying 50 nm or more.

2) Evaluation of the Light Emission Characteristic in the Light Emitting Device

The phosphor mixture, in which the samples 1 and 3 are mixed, and the silicon resin were mixed and adjusted in the same way as the example 1, which was then applied on the element releasing the light with the wavelength of 467 nm, and the light emitting device releasing the light of white color was prepared. The current of DC 20.0 mA was run through the light emission element, and when the correlated color temperature of the emission spectrum of the light emitting device was measured, it was 4188K. This revealed that the approximately the target correlated color temperature was exhibited. Further, when the chromaticity of the emission spectrum was measured, it was x=0.3723, and y=0.3706. The emission spectrum thus obtained is shown by one-dot chain line in FIG. 4.

3) Evaluation of the Color Rendering Properties in the Light Emitting Device

Based on the JIS Z 8726, the color rendering properties in the light emission of the light emitting device was evaluated. The general color rendering index Ra was 85, and the special color rendering index R9 was 80, R10 was 72, R11 was 86, R12 was 67, R13 was 90, R14 was 91, and R15 was 87.

4) Evaluation of the Color Shift due to the Feeding Current to the Light Emitting Device The currents of DC 2.0 mA to 24.0 mA were fed to the light emitting device thus manufactured, and the color shift to the current was evaluated and the evaluation result was shown in table 5 and described in FIG. 3. FIG. 3 is a graph showing chromaticity x in the ordinate, and showing chromaticity y in the abscissa, wherein the value of the chromaticity in the light emission when the currents of DC 2.0 mA, 5.0 mA, 10.0 mA, 15.0 mA, 20.0 mA, and 24.0 mA were fed to the light emitting device thus manufactured is plotted by using □, and the plotted dots are connected by a solid line.

TABLE 5

| FEEDING CURRENT (mA) | SURFACE TEMPERATURE (° C.) | CHROMATICITY | |
|---|---|---|---|
| | | x | y |
| 24.0 | 49.5 | 0.372 | 0.371 |
| 20.0 | 46.1 | 0.373 | 0.373 |
| 15.0 | 41.5 | 0.374 | 0.374 |
| 10.0 | 35.7 | 0.375 | 0.376 |
| 5.0 | 31.0 | 0.375 | 0.379 |
| 2.0 | 28.1 | 0.376 | 0.380 |

What is claimed is:

1. A phosphor mixture, which emits a visible light under an excitation of an excitation light of ultraviolet to green color, wherein under the excitation of the excitation light with a wavelength range from 430 nm to 500 nm, a peak value of a relative emission intensity at the temperature of 25° C. is defined as $P_{25}$, and the peak value of the relative emission intensity at the temperature of T° C. is defined as $P_T$, and when the value of T is changed in a range from 25° C. to 200° C., the value of $(100 \times (P_{25} - P_T)/P_{25})$ is within ±25.

2. The phosphor mixture according to claim 1, comprising:
a phosphor which is given as a composition formula expressed by MmAaBbOoNn:Z, (where element M is at least one or more kind of element having bivalent valency, element A is more than one kind of element having tervalent valency, element B is at least one or more kind of element having tetravalent valency, O is oxygen, N is nitrogen, and element Z is at least one or more kind of element acting as an activator, satisfying m=a=b=1, o<0.5, n=3−(⅔)o); and more than one kind of phosphor having an emission spectrum with an emission peak in the wavelength range from 500 nm to 630 nm when excited by ultraviolet to green excitation light.

3. The phosphor mixture according to claim 2, wherein the element M is at least one or more kind of element selected from the group consisting of Ca, Mg, Sr, Ba, and Zn;

the element A is at least one or more kind of element selected from the group consisting of Al, and Ga;

the element B is at least one or more kind of element selected from the group consisting of Si and Ge; and the element Z is at least one or more kind of element selected from rare earth elements and transitional metal elements.

4. The phosphor mixture according to claim 3, wherein the element Z is Eu.

5. The phosphor mixture according to claim 2, wherein the phosphor expressed by the composition formula $M_mA_aB_bO_oN_n$:Z is the phosphor having the composition formula $CaAlSiN_3$:Eu.

6. The phosphor mixture according to claim 2, wherein the phosphor having an emission spectrum with an emission peak in the wavelength range from 500 nm to 630 nm when excited by ultraviolet to green excitation light is the phosphor having a garnet crystal structure with Ce as an activator.

7. The phosphor mixture according to claim 6, wherein the phosphor having the garnet crystal structure with the Ce as the activator, is an Al garnet phosphor containing Y and/or Tb.

8. The phosphor mixture according to claim 6, wherein the phosphor having the garnet crystal structure with the Ce as the activator, is a Si garnet phosphor containing Sc.

9. The phosphor mixture according to claim 1, wherein each of the phosphors is a particle with an average particle size (D50) of 1 to 20 μm.

10. The phosphor mixture according to claim 1, wherein each of the phosphors has the emission spectrum with a half value width of 50 nm or more.

11. The phosphor mixture according to claim 1, having the emission spectrum with two or more emission peaks in the wavelength range from 500 nm to 780 nm, and having a continuous spectrum without a break in the wavelength range from 500 nm to 780 nm, in the emission spectrum under an excitaion of the excitation light in the wavelength range from 430 nm to 500 nm.

12. The phosphor mixture according to claim 1, wherein a chromaticity of the emission spectrum satisfies x>0.2, and y>0.2, in the emission spectrum under the excitation of the excitation light with the wavelength range from 430 nm to 500 nm.

13. A light emitting device, comprising the phosphor mixture according to claim 1, and a light emitting part emitting light with the wavelength range from 430 nm to 500 nm.

14. The light emitting device according to claim 13, wherein the light emitting part is a light emitting diode (LED).

15. The light emitting device according to claim 14, wherein the light emitting part is a light emitting diode (LED) composed of a material containing Ga.

16. The light emitting device according to claim 13, wherein a general color rendering index Ra of the light emitting device is not less than 80.

17. The light emitting device according to claim 13, wherein a special color rendering index R9 of the light emitting device is not less than 60.

18. The light emitting device according to claim 13, wherein the special color rendering index R15 of the light emitting device is not less than 80.

19. The light emitting device according to claim 13, wherein a correlated color temperature of the light emitting device is in a range from 7000K to 2500K.

* * * * *